United States Patent [19]
Durham et al.

[11] Patent Number: 5,870,411
[45] Date of Patent: Feb. 9, 1999

[54] METHOD AND SYSTEM FOR TESTING SELF-TIMED CIRCUITRY

[75] Inventors: Christopher McCall Durham; Peter Juergen Klim; Srinivas Patil, all of Austin, Tex.

[73] Assignee: International Business Machines Corporation, Armonk, N.Y.

[21] Appl. No.: 767,243

[22] Filed: Dec. 13, 1996

[51] Int. Cl.[6] ................................................. G01R 31/28
[52] U.S. Cl. .............................................. 371/22.5; 326/93
[58] Field of Search ................................ 371/22.5, 22.31, 371/22.32, 27.7, 22.1, 22.2, 22.36, 27.5; 395/285, 183.01, 183.06, 183.18, 831; 326/93, 16; 365/201, 233; 364/488–491; 327/41

[56] References Cited

U.S. PATENT DOCUMENTS

| | | | |
|---|---|---|---|
| 5,121,003 | 6/1992 | Williams | 307/452 |
| 5,289,403 | 2/1994 | Yetter | 365/49 |
| 5,386,585 | 1/1995 | Traylor | 395/800 |
| 5,394,403 | 2/1995 | Klein | 371/21.1 |
| 5,446,695 | 8/1995 | Douse et al. | 365/222 |
| 5,450,020 | 9/1995 | Jones et al. | 326/31 |
| 5,471,428 | 11/1995 | Baroni et al. | 365/201 |
| 5,615,169 | 3/1997 | Leung | 365/233.5 |
| 5,703,821 | 12/1997 | Baroni et al. | 315/210 |
| 5,703,823 | 12/1997 | Douse et al. | 365/222 |
| 5,710,910 | 1/1998 | Kehl et al. | 395/551 |

*Primary Examiner*—Robert W. Beausoliel, Jr.
*Assistant Examiner*—Nadeem Iqbal
*Attorney, Agent, or Firm*—Casimer K. Salys; Michael A. Davis, Jr.

[57] ABSTRACT

From a first circuit, first information is output in response to acknowledgement signals. From a second circuit, second information and the acknowledgement signals are output. The second information and the acknowledgement signals are output in response to the second circuit receiving portions of the first information from the first circuit during a functional mode of operation. The portions and the acknowledgement signals are output asynchronously with respect to one another. From a third circuit, third information is output in response to the second information. From a test circuit, the second information output from the second circuit is specified, so that the third circuit outputs the third information in response to the specified second information independent of the first information output from the first circuit during a test mode of operation.

6 Claims, 10 Drawing Sheets

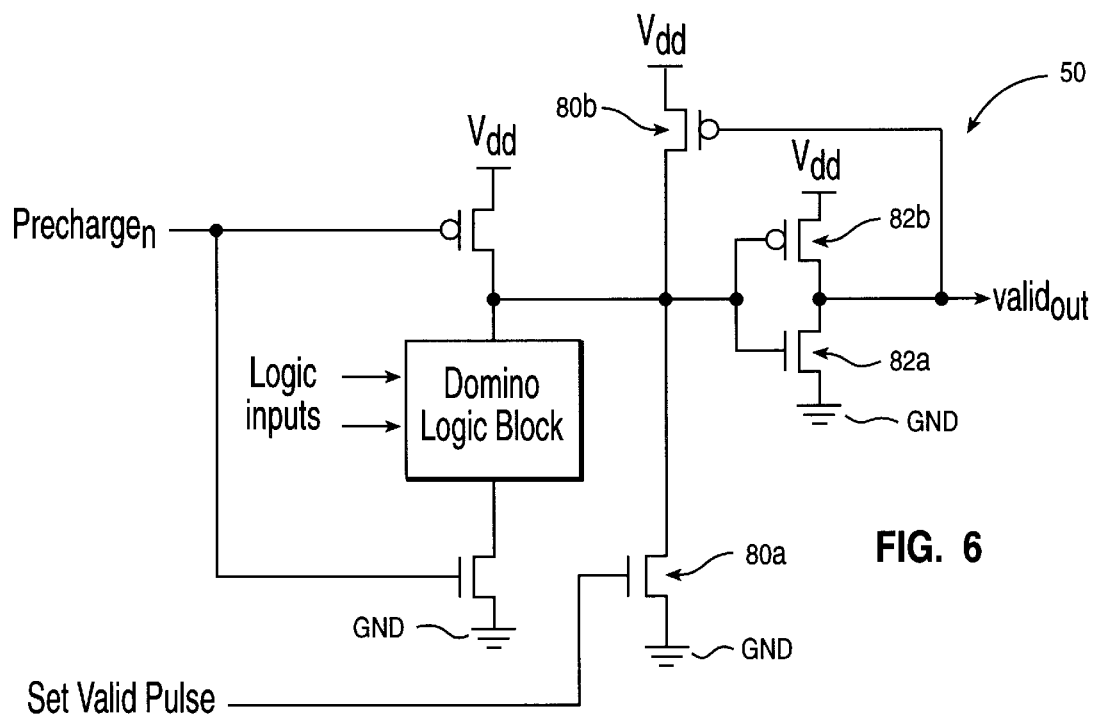
FIG. 6
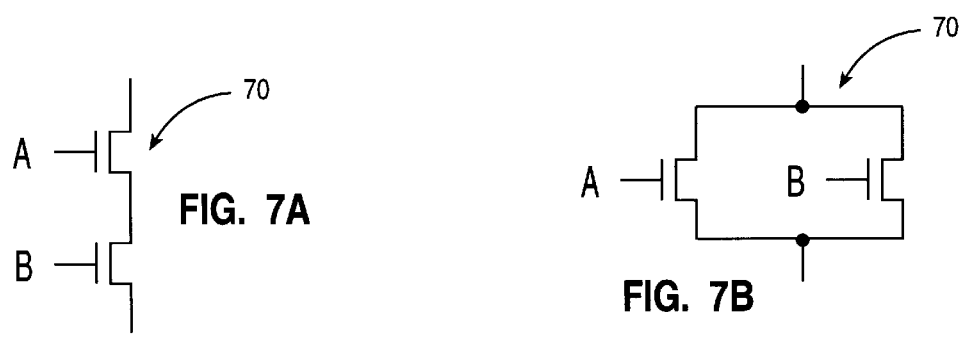
FIG. 7A
FIG. 7B
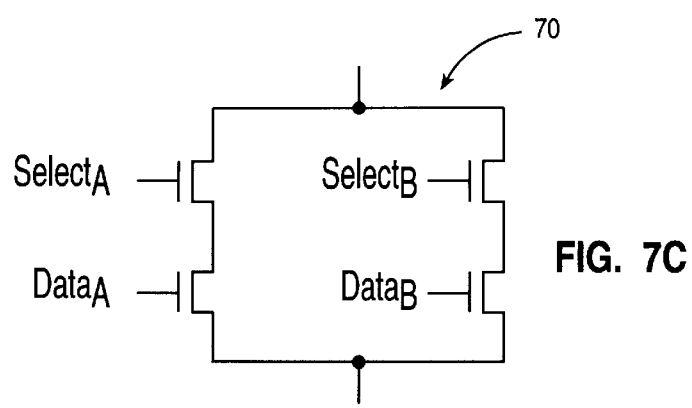
FIG. 7C

METHOD AND SYSTEM FOR TESTING SELF-TIMED CIRCUITRY

CROSS-REFERENCE TO RELATED APPLICATION

This patent application is related to coassigned copending U.S. patent application Ser. No. 08/767,244 filed concurrently herewith, which is hereby fully incorporated by reference herein.

TECHNICAL FIELD

This patent application relates in general to electronic circuitry and in particular to a method and system for testing self-timed circuitry.

BACKGROUND

Self-timed circuitry is useful for very large scale integration ("VLSI") circuits. Self-timed circuitry outputs one or more signals in response to an asynchronous signal. The asynchronous signal is representative, for example, of a next instruction or request.

During a waiting period, the self-timed circuitry waits for the asynchronous signal. During the waiting period, the self-timed circuitry consumes less power because it performs fewer operations. Moreover, self-timed circuitry achieves faster cycle times because its asynchronous operation is not constrained by a predetermined worst-case clock frequency.

By comparison, traditional synchronous circuitry operates in response to a synchronous clock signal, which is constrained by a predetermined worst-case clock frequency. Relative to comparable self-timed circuitry, the synchronous circuitry consumes extra power. This is because clock signals continue transitioning within the synchronous circuitry, even while the synchronous circuitry is not performing an operation. This extra power can be significant. For example, it is possible for clock circuitry to consume 30% of a synchronous VLSI circuit's total power.

Nevertheless, self-timed circuitry does present challenges. For example, self-timed integrated circuitry is relatively difficult to test. By comparison, synchronous integrated circuitry is more readily testable according to Level Sensitive Scan Design ("LSSD") techniques.

LSSD techniques are less practically applied to self-timed integrated circuitry, because self-timed integrated circuitry is asynchronous and therefore includes fewer latches. Moreover, the boundary between state elements and combinational logic is less clear within self-timed circuitry, due to its asynchronous mutual handshaking protocol. Accordingly, LSSD compatible latches are more difficult to implement within self-timed integrated circuitry.

Instead, self-timed integrated circuitry is more readily tested by applying stimuli to the circuitry's inputs and monitoring the circuitry's outputs. By applying stimuli, testing of self-timed integrated circuitry is more difficult within large dataflow systems. Also, it is more difficult to reduce the frequency of self-timed circuitry in order to match slower test hardware.

Thus, a need has arisen for a method and circuitry for testing self-timed circuitry, in which self-timed integrated circuitry is more practically testable.

SUMMARY

From a first circuit, first information is output in response to acknowledgement signals. From a second circuit, second information and the acknowledgement signals are output. The second information and the acknowledgement signals are output in response to the second circuit receiving portions of the first information from the first circuit during a functional mode of operation. The portions and the acknowledgement signals are output asynchronously with respect to one another. From a third circuit, third information is output in response to the second information. From a test circuit, the second information output from the second circuit is specified, so that the third circuit outputs the third information in response to the specified second information independent of the first information output from the first circuit during a test mode of operation.

It is a technical advantage that self-timed integrated circuitry is more practically testable.

BRIEF DESCRIPTION OF THE DRAWINGS

An illustrative embodiment and its advantages are better understood by referring to the following descriptions and accompanying drawings, in which:

FIG. 6 is a schematic electrical circuit diagram of a valid logic circuit of the self-resetting logic row of FIG. 4;

FIGS. 7a–c are schematic electrical circuit diagrams of example domino logic blocks of the circuits of FIGS. 5 and 6;

DETAILED DESCRIPTION

An illustrative embodiment and its advantages are better understood by referring to FIGS. 1–11 of the drawings.

Figure 1:
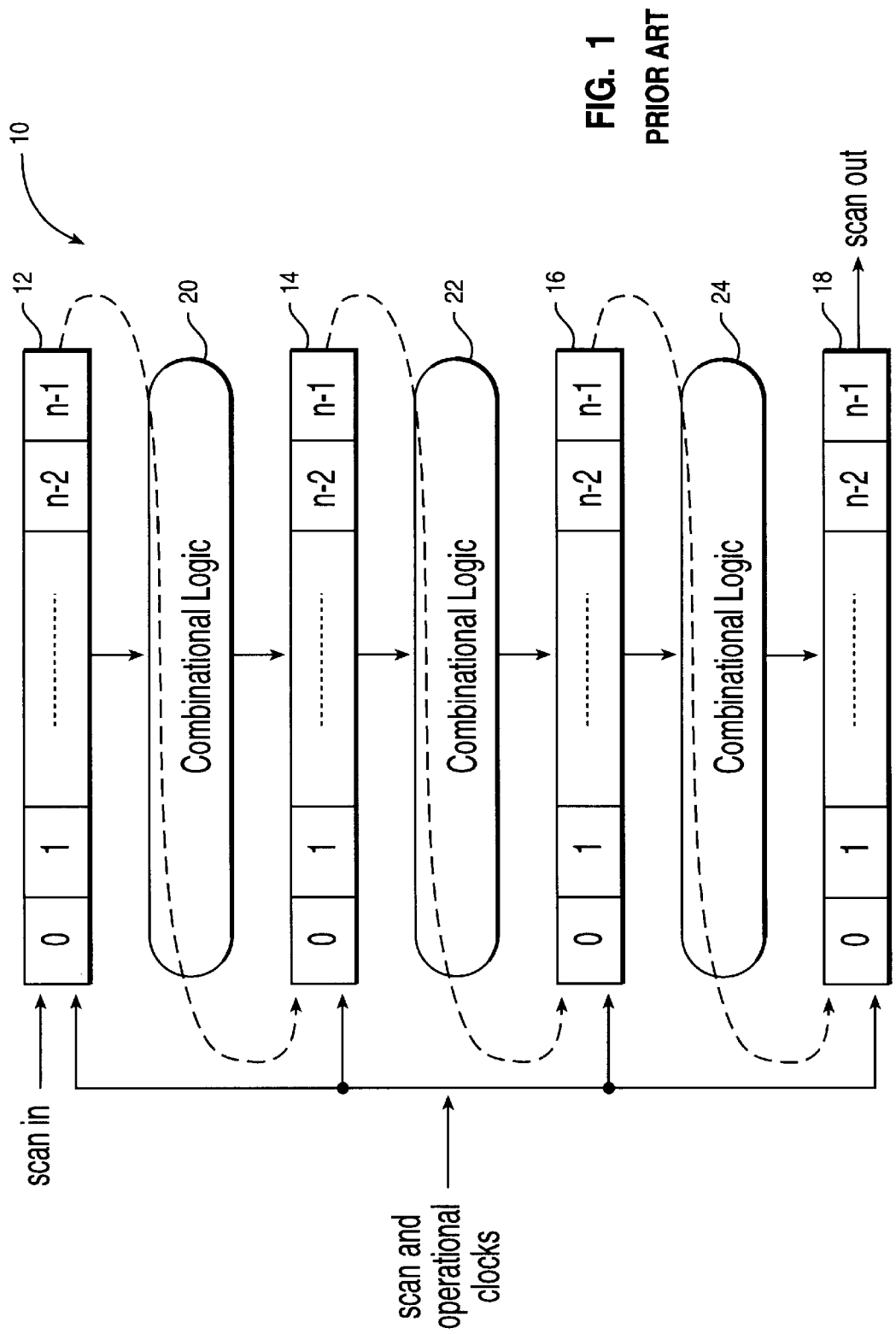
FIG. 1 is a block diagram of a synchronous logic circuit pipeline, according to the prior art.

FIG. 1 is a block diagram of a synchronous logic circuit pipeline, indicated generally at 10, according to the prior art. Pipeline 10 includes scannable registers 12, 14, 16 and 18, each having a respective group of n-bits numbered 0 through n−1 (where n is an integer number greater than 0). As shown in FIG. 1, registers 12, 14, 16 and 18 define pipeline stage boundaries around combinational logic 20, 22 and 24.

For example, registers 12 and 14 define a pipeline stage boundary around combinational logic 20. In this manner, combinational logic 20 is readily accessible, since combinational logic 20 inputs information from register 12 and outputs information to register 14. Similarly, registers 14 and 16 define a pipeline stage boundary around combinational logic 22, and registers 16 and 18 define a pipeline stage boundary around combinational logic 24.

A Scan In line is connected to bit 0 of register 12. As indicated by dashed lines in FIG. 1, bit n−1 of register 12 is connected bit 0 of register 14, and bit n−1 of register 14 is connected to bit 0 of register 16. Similarly, bit n−1 of register 16 is connected to bit 0 of register 18, and bit n−1 of register 18 is connected to a Scan Out line. Each of registers 12, 14, 16 and 18 receives common synchronous scan and operational clocks.

LSSD techniques facilitate the analysis of design and/or manufacturing defects within integrated circuitry, where the integrated circuitry includes pipeline 10. For example, if the Scan In and Scan Out lines are connected to other devices external to the integrated circuitry. then a logic state is readily established within pipeline 10. According to LSSD techniques, this is achieved by serially scanning information (i.e. a test pattern) bit-by-bit into register 12 from Scan In and then serially shifting the information through registers 12, 14, 16 and 18 during a test mode of operating pipeline 10. Moreover, it is possible for registers 12, 14, 16 and 18 to store information resulting from a functional mode of operating pipeline 10. In either situation, the logic state of pipeline 10 is readily accessed by serially shifting information through registers 12, 14, 16 and 18 until the information is output to Scan Out from bit n−1 of register 18.

Pipeline 10 is sufficiently testable in response to a predetermined sequence of test patterns. By partitioning pipeline 10 into pipeline stage boundaries, LSSD techniques facilitate a reduction in the number of test patterns for testing pipeline 10 to a predetermined level of confidence (measured in terms of fault coverage). By reducing the number of test patterns (or "test volume"), LSSD techniques are more readily adapted for use with external test hardware having a limited amount of memory for storing the test patterns.

For timing related or alternating current ("AC") tests, LSSD techniques support manipulation of clocks while pipeline 10 operates in the test mode. This provides a tool for identifying problems that originate from timing errors and manufacturing defects in the design of pipeline 10. Such control could be impractical while pipeline 10 operates in the functional mode, particularly if different clock signals originate from a single master oscillator.

LSSD techniques are readily adapted for use within synchronous systems such as pipeline 10, because synchronous systems already include pipeline structures with internal latches (e.g. registers 12, 14, 16 and 18). For example, registers 12, 14, 16 and 18 are implemented to be serially scannable shift registers, compatible with LSSD techniques. Within a particular pipeline stage, a portion of logic (e.g. combinational logic 20) between scannable latches (e.g. registers 12 and 14) is readily tested by serially scanning (or shifting) a predetermined test pattern into the latches, without regard to other portions of logic before or after the particular pipeline stage being tested.

According to LSSD techniques, latches during the test mode are sensitive to logic levels of a clock signal, rather than being edge-triggered (i.e. sensitive to transitions of the clock signal). Further, according to LSSD techniques, pipeline 10 remains functional even if clock frequencies are reduced. In that manner, pipeline 10 is testable under non-functional operating conditions at a slower clock frequency (relative to the functional mode). With the slower clock frequency, the operation of pipeline 10 is more controllable.

Figure 2:
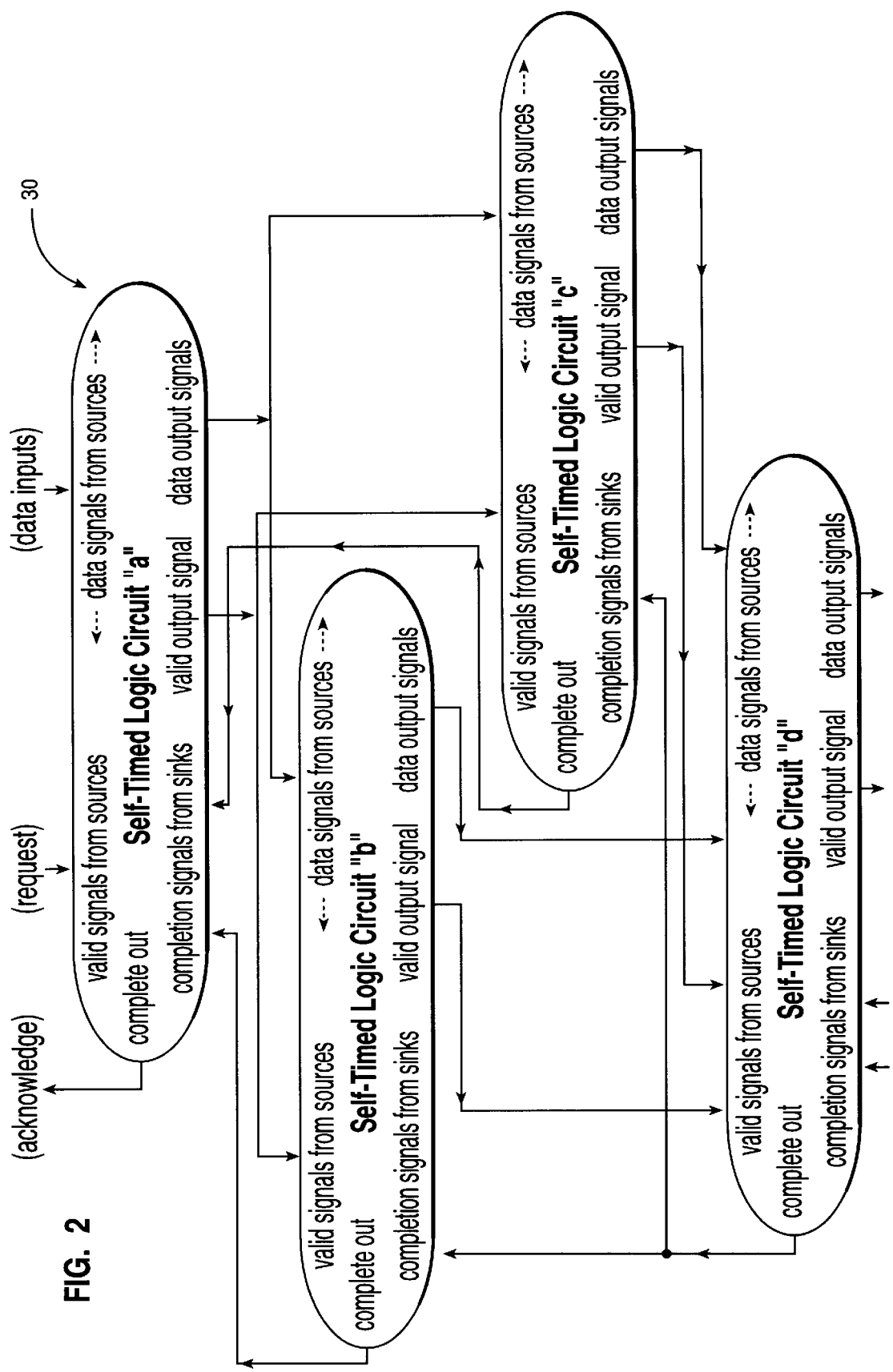
FIG. 2 is a block diagram of a self-timed logic circuit pipeline, according to the illustrative embodiment.

FIG. 2 is a block diagram of a self-timed logic circuit pipeline, indicated generally at 30, according to the illustrative embodiment. In the illustrative embodiment, pipeline 30 is formed within integrated circuitry. Pipeline 30 includes self-timed logic circuits "a", "b", "C" and "d".

Each of circuits "a", "b", "c" and "d" includes a respective group of input/output nodes connected to external controls and/or other self-timed circuitry. For example, each of circuits "a", "b", "c" and "d" includes a respective group of (1) Valid Signals from Sources, (2) Data Signals from Sources, (3) Complete Out, (4) Completion Signals from Sinks, (5) Valid Output Signal, and (6) Data Output Signals nodes. Moreover, circuits "a", "b", "c" and "d" are interconnected as shown in FIG. 2.

Continued proper operation of a self-timed logic circuit (e.g. circuit "a") depends upon the self-timed logic circuit receiving an acknowledgment signal from another device (e.g. circuit "a" receiving an acknowledgment signal at its "Completion Signals from Sinks" node from the "Complete Out" node of circuit "b") in response to signals from the self-timed logic circuit (e.g. in response to signals from the "Valid Output Signal" and "Data Output Signals" nodes of circuit "a"). Signal timing within the self-timed logic circuit becomes more complicated if the self-timed logic circuit depends upon acknowledgment signals from multiple devices (e.g. circuit "a" depends upon acknowledgment signals from circuits "b" and "c").

The operation of pipeline 30 is discussed hereinbelow. In FIG. 2, each of circuits "a", "b", "c" and "d" itself can be a combination of multiple self-timed logic circuit stages and, thus, can operate internally as discussed hereinbelow. In response to circuit "a" receiving one or more "request" signals from a source device (not shown in FIG. 2 for clarity) at the "Valid Signals from Sources" node of circuit "a", circuit "a" (1) receives "data inputs" (e.g. signals and/or information from a bus) from the source device at the "Data Signals from Sources" node of circuit "a" and then (2) outputs an "acknowledge" signal (to the source device) at the "Complete Out" node of circuit "a". In response to the "acknowledge" signal, the source device is free to perform other operations and to de-assert the "request" signal (and "data inputs") to circuit "a".

Circuit "a" performs one or more operations in response to the "data inputs" received by circuit "a" from the source device. After performing such operations, circuit "a" (1) outputs a "valid" signal to circuits "b" and "c" at the "Valid Output Signal" node of circuit "a" and accordingly (2) outputs signals and/or information to circuits "b" and "c" at the "Data Output Signals" node of circuit "a".

In response to circuit "b" receiving the "valid" signal from circuit "a" at the "Valid Signals from Sources" node of circuit "b", circuit "b" (1) receives the signals and/or information from circuit "a" at the "Data Signals from Sources" node of circuit "b" and then (2) outputs an "acknowledge" signal (to circuit "a") at the "Complete Out" node of circuit "b". Likewise, circuit "c" responds in the same manner, in response to circuit "c" receiving the "valid" signal from circuit "a" at the "Valid Signals from Sources" node of circuit "c". In response to receiving "acknowledge" signals from both circuits "b" and "c", circuit "a" performs other operations (e.g. receive further information from the source device and output further signals and/or information to circuits "b" and "c") and de-asserts the "valid" signal (and other signals/information) to circuits "b" and "c".

Circuits "b" and "c" perform operations in response to the signals and/or information received by circuits "b" and "c" from circuit "a". After performing such operations, each of circuits "b" and "c" (1) outputs a respective "valid" signal to circuit "d" and accordingly (2) outputs signals and/or information to circuit "d". In response to circuit "d" receiving "valid" signals from both circuits "b" and "c" at the "Valid Signals from Sources" node of circuit "d", circuit "d" (1) receives signals and/or information from both circuits "b" and "c" at the "Data Signals from Sources" node of circuit "d" and then (2) outputs "acknowledge" signals (to circuits "b" and "c") at the "Complete Out" node of circuit "d". After circuit "d" responds to circuits "b" and "c", circuits "b" and "c" perform other operations (e.g. receive further information from circuit "a" and output further signals and/or information to circuit "d") and de-assert the "valid" signals (and other signals/information) to circuit "d".

Circuit "d" performs one or more operations in response to the signals and/or information received by circuit "d" from circuits "b" and "c". After performing such operations, circuit "d" (1) outputs a "valid" signal to one or more additional devices (not shown in FIG. 2 for clarity) and accordingly (2) outputs signals and/or information to each such additional device. After each such additional device outputs an "acknowledge" signal to circuit "d", circuit "d" performs other operations (e.g. receive further information from circuits "b" and "c" and output further signals and/or information to each such additional device) and de-asserts the "valid" signals (and other signals/information) to the additional devices.

By using a combination of "valid" and "acknowledge" signals, pipeline 30 is self-timed, as circuits "a", "b", "c" and "d" synchronize their respective operations relative to one another without reliance upon a common synchronous clock signal (i.e. a clock signal synchronously received by circuits "a", "b", "c" and "d" at substantially the same moment in time). In that manner, circuits "a", "b", "c" and "d" output their respective "valid" and "acknowledge" signals asynchronously with respect to one another, so that such signals are output without reference to a common synchronous clock signal. Thus, the amount of elapsed time between any two "valid" and "acknowledge" signals of pipeline 30 is a variable time, is unconstrained by any predetermined clock period, and is therefore subject to being a non-integer multiple of such predetermined clock period.

Accordingly, within pipeline 30 of the illustrative embodiment, no registers are interposed between circuits "a", "b", "c" and/or "d". Thus, LSSD compatible latches are more difficult to implement within pipeline 30, and LSSD techniques are less practically applied to pipeline 30. Nevertheless, in a significant aspect of the illustrative embodiment, pipeline 30 advantageously includes scannable data points and is therefore more practically testable than previous self-timed integrated circuitry.

Figure 3:
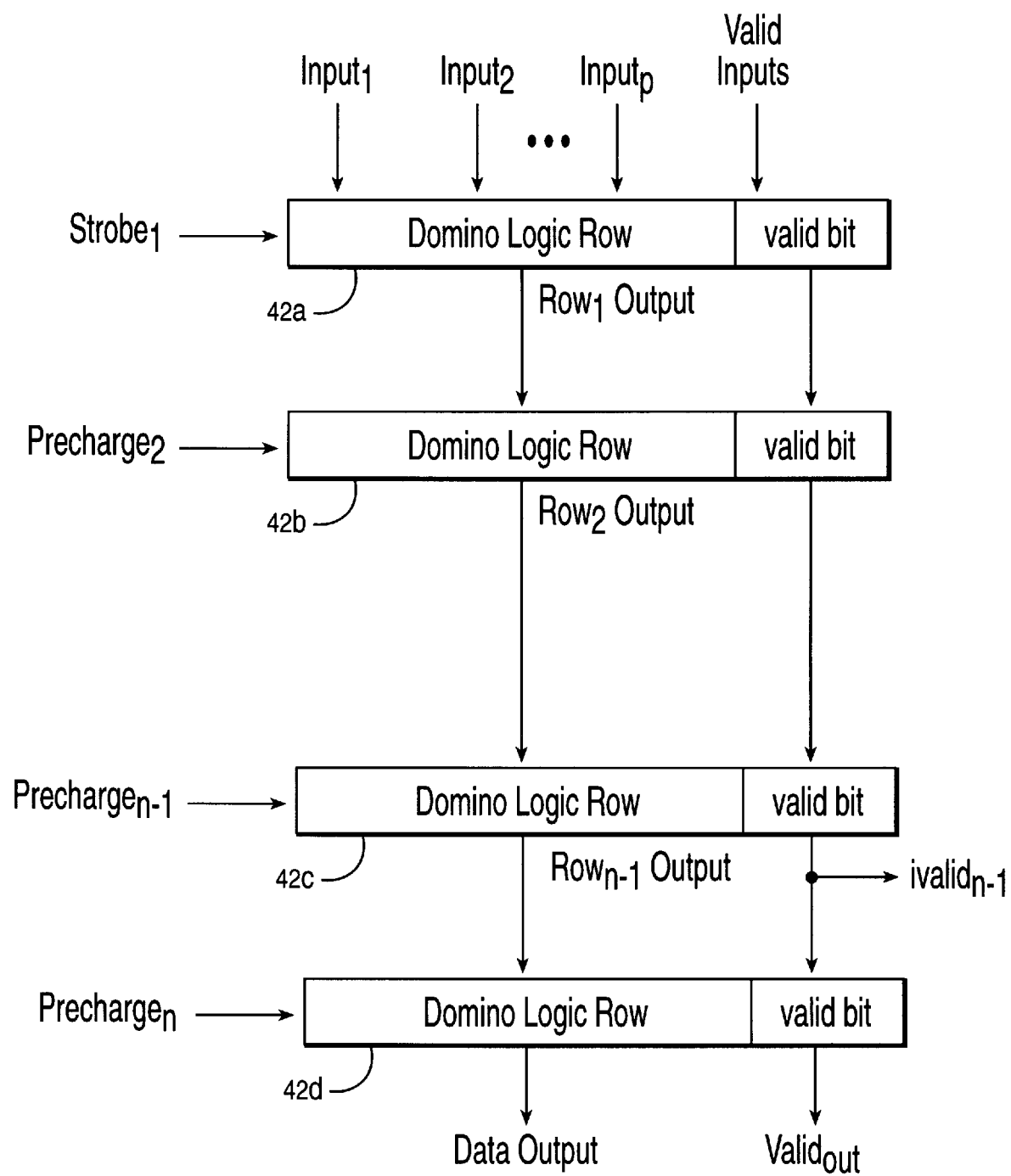
FIG. 3 is a block diagram of a self-timed logic circuit of FIG. 2.

FIG. 3 is a block diagram of self-timed logic circuit "a" of FIG. 2. Circuit "a" is a representative one of circuits "a", "b", "c" and "d", which are substantially identical to one another. Circuit "a" includes (1) n number of logic rows 42a–d, where n is an integer number, and (2) a control circuit (not shown in FIG. 3) discussed further hereinbelow in connection with FIGS. 4 and 8. In FIG. 3, n=4. From the control circuit, logic rows 42a–d input precharge signals through lines Strobe$_1$, Precharge$_2$, Precharge$_{n-1}$ and Precharge$_n$, respectively. Each of logic rows 42a–d includes a respective Domino Logic Row and Valid Bit.

As shown in FIG. 3, logic row 42a receives (1) data signals through multiple input lines, namely Input$_1$ through Input$_p$ (where p is an integer number), from the "Data Signals from Sources" node of circuit "a" and (2) one or more valid signals through Valid Inputs lines from the "Valid Signals from Sources" node of circuit "a". The valid signals indicate whether the data signals of Input$_1$ through Input$_p$ are valid.

In response to such data signals and valid signals, logic row 42a performs operations and outputs data signals and one or more valid signals to logic row 42b through Row$_1$ Output lines. Similarly, in response to the data signals and valid signals from Row$_1$ Output lines, logic row 42b performs operations and outputs data signals and one or more valid signals to logic row 42c through Row$_2$ Output lines. Likewise, in response to the data signals and valid signals from Row$_2$ Output lines, logic row 42c performs operations and outputs data signals and valid signals (including at least an invalid$_{n-1}$ signal on an invalid$_{n-1}$ line) to logic row 42d through Row$_{n-1}$ Output lines. Further, in response to the data signals and valid signals from Row$_{n-1}$ Output lines, logic row 42d performs operations and outputs (1) data signals through Data Output lines to the "Data Output Signals" node of circuit "a" and (2) a valid signal through a Valid$_{out}$ line to the "Valid Output Signal" node of circuit "a".

Various other connections and signals are not shown in FIG. 3 for clarity. In FIG. 3, logic rows 42a–d are self-resetting. In an alternative embodiment, logic rows 42a–d are self-timed. If logic rows 42a–d are self-timed, they operate as discussed further hereinabove in connection with FIG. 2.

In the illustrative embodiment, pipeline 30 operates in a manner consistent with LSSD techniques during the test mode, yet has very low hardware or timing overhead during the functional mode. Accordingly, pipeline 30 is more practically testable than previous self-timed integrated circuitry. Toward achieving this goal, in a significant aspect of the illustrative embodiment, pipeline 30 advantageously includes scannable data points for writing and reading information to and from logic rows 42a–d, as discussed further hereinbelow in connection with FIGS. 4–11. Thus, pipeline 30 advantageously is more practically testable than previous self-timed integrated circuitry.

Figure 4:
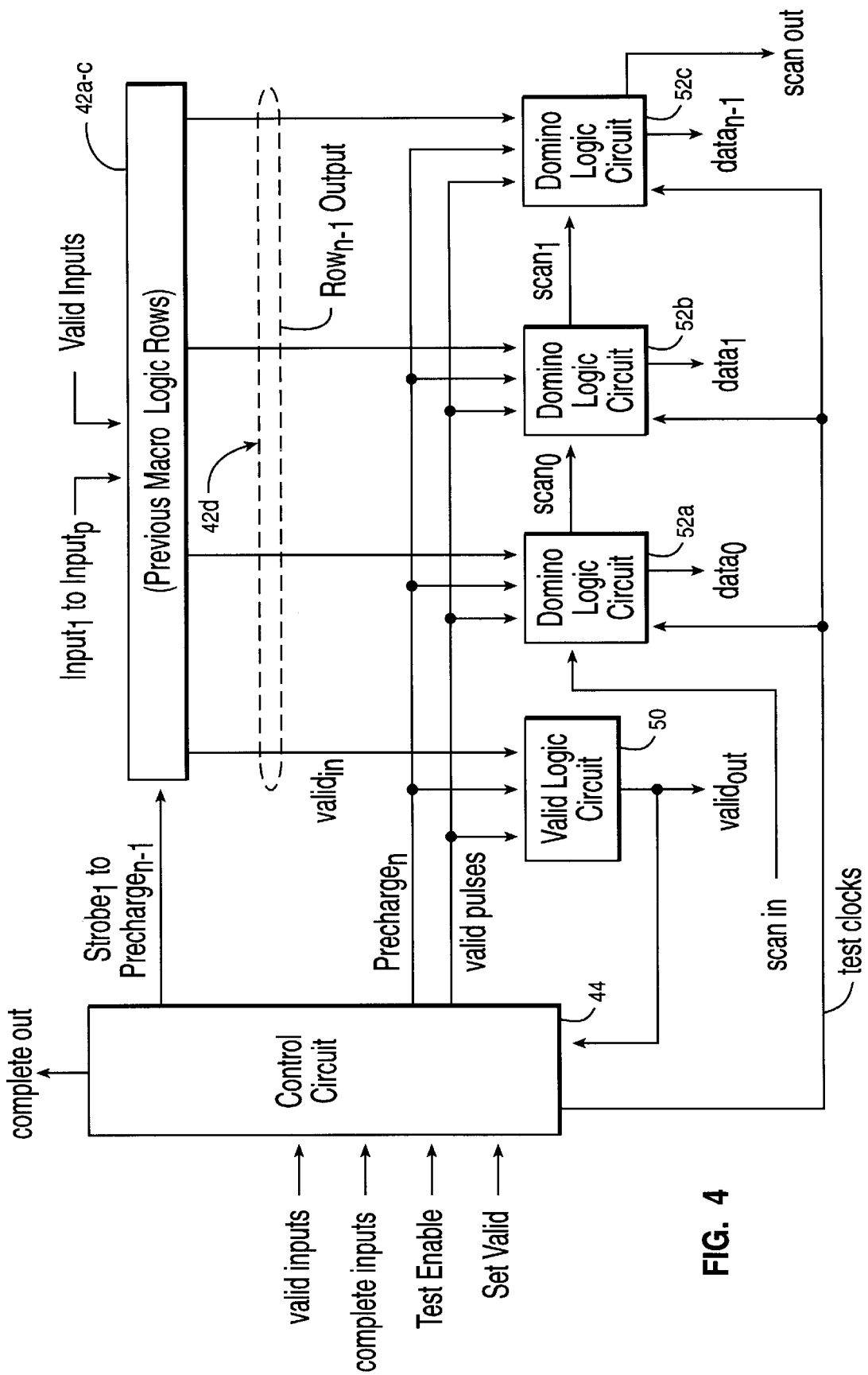
FIG. 4 is a block diagram of a self-resetting logic row of the self-timed logic circuit of FIG. 3.

FIG. 4 is a block diagram of logic row 42d of FIG. 3. Logic row 42d is a representative one of logic rows 42a–d, which are substantially identical to one another. In a significant aspect of the illustrative embodiment, logic row 42d is connected to (1) a Scan In line, (2) a Scan Out line, (3) a Test Enable line and (4) the Test Clocks lines. As shown in FIG. 4, logic row 42d includes a valid logic circuit 50 and n number of domino logic circuits 52a–c (where n is an integer number). As shown in FIG. 4, n=3.

FIG. 4 also shows control circuit 44 of circuit "a", as mentioned hereinabove in connection with FIG. 3. Control circuit 44 receives (1) valid signals through Valid Inputs lines from the "Valid Signals from Sources" node of circuit "a", (2) acknowledgment signals through Complete Inputs lines from the "Completion Signals from Sinks" node of circuit "a", (3) the Test Enable line, (4) a Valid$_{out}$ signal through a Valid$_{out}$ line from the output of valid logic circuit 50, and (5) a set valid signal through a Set Valid line from a decoder as discussed further hereinbelow in connection with FIG. 11. The valid signals indicate whether the data signals of Input$_1$ through Input$_p$ are valid. The Valid$_{out}$ line is connected to the "Valid Output Signal" node of circuit "a". Control circuit 44 outputs (1) an acknowledgment signal through a Complete Out line to the "Complete Out" node of circuit "a", (2) the precharge signals through lines Strobe$_1$, Precharge$_2$, Prechargen$_{n-1}$ and Precharge$_n$ as discussed further hereinabove in connection with FIG. 3, (3) valid pulse signals through Valid Pulses lines to circuits 50 and 52a–c as discussed further hereinbelow in connection with FIG. 5, and (4) test clock signals through Test Clocks lines as discussed further hereinbelow in connection with FIG. 5.

Valid logic circuit 50 receives (1) one or more valid signals through Valid$_{in}$ line(s) of the Row$_{n-1}$ Output lines discussed further hereinabove in connection with FIG. 3, (2) a precharge signal through the Precharge$_n$ line, and (3) a set valid pulse signal from a Set Valid Pulse line (FIGS. 6 and 8) of the Valid Pulses lines. In response to such signals, valid logic circuit 50 outputs a valid signal through a Valid$_{out}$ line to the "Valid Output Signal" node of circuit "a".

Domino logic circuit 52a receives (1) a Scan In signal through the Scan In line, (2) the test clock signals through Test Clocks lines, (3) the precharge signal through the Precharge$_n$ line, (4) data signals through Row$_{n-1}$ Output lines, and (5) valid pulse signals through a Valid Pulse line and its associated $\overline{\text{Valid Pulse}}$ line (of the Valid Pulses lines) having respective logic states opposite from one another, as discussed further hereinbelow in connection with FIGS. 5 and 8. In response to such signals, domino logic circuit 52a outputs (1) a data signal through a Data$_0$ line to the "Data Output Signals" node of circuit "a" and (2) a scan signal through a Scan$_0$ line to domino logic circuit 52b.

Similarly, domino logic circuit 52b receives (1) the scan signal through the Scan$_0$ line from domino logic circuit 52a, (2) the test clock signals through Test Clocks lines, (3) the precharge signal through the Precharge$_n$ line, (4) data signals through Row$_{n-1}$ Output lines, and (5) the valid pulse signals through the Valid Pulse line and its associated $\overline{\text{Valid Pulse}}$ line. In response to such signals, domino logic circuit 52b outputs (1) a data signal through a Data$_1$ line to the "Data Output Signals" node of circuit "a" and (2) a scan signal through a Scan$_1$ line to domino logic circuit 52c.

Likewise, domino logic circuit 52c receives (1) the scan signal through the Scan$_1$ line from domino logic circuit 52b, (2) the test clock signals through Test Clocks lines, (3) the precharge signal through the Precharge$_n$ line, (4) data signals through Row$_{n-1}$ Output lines, and (5) the valid pulse signals through the Valid Pulse line and its associated $\overline{\text{Valid Pulse}}$ line. In response to such signals, domino logic circuit 52c outputs (1) a data signal through a Data$_{n-1}$ line to the "Data Output Signals" node of circuit "a" and (2) a Scan Out signal through the Scan Out line.

Test Clocks lines include (1) a Test Clock A line and its associated $\overline{\text{Test Clock A}}$ line having respective logic states opposite from one another, and (2) a Test Clock B line and its associated $\overline{\text{Test Clock B}}$ line having respective logic states opposite from one another, as discussed further hereinbelow in connection with FIG. 5. Moreover, in FIG. 4, it is possible for one or more of domino logic circuits 52a–c to receive data signals from the Data$_0$, Data$_1$ and/or Data$_{n-1}$ lines, in addition to data signals received through Row$_{n-1}$ Output lines, in order to satisfy particular logic operation goals for a specific implementation of circuit "a". Various other connections and signals are not shown in FIG. 4 for clarity.

Advantageously, logic row 42d is testable, as it is connected to (1) a Scan In line, (2) a Scan Out line, (3) a Test Enable line and (4) one or more Test Clocks lines. With such connections, logic row 42d is operable to both read and write data into Data$_0$, Data$_1$ and Data$_{n-1}$. Accordingly, logic row 42d supports (1) reading (through the Scan Out line) logic states of Data$_0$, Data$_1$ and Data$_{n-1}$ that resulted from operation of logic row 42d in the functional mode and (2) writing (through the Scan In line) logic states of Data$_0$, Data$_1$ and Data$_{n-1}$ during the test mode of operating logic row 42d.

Figure 5:
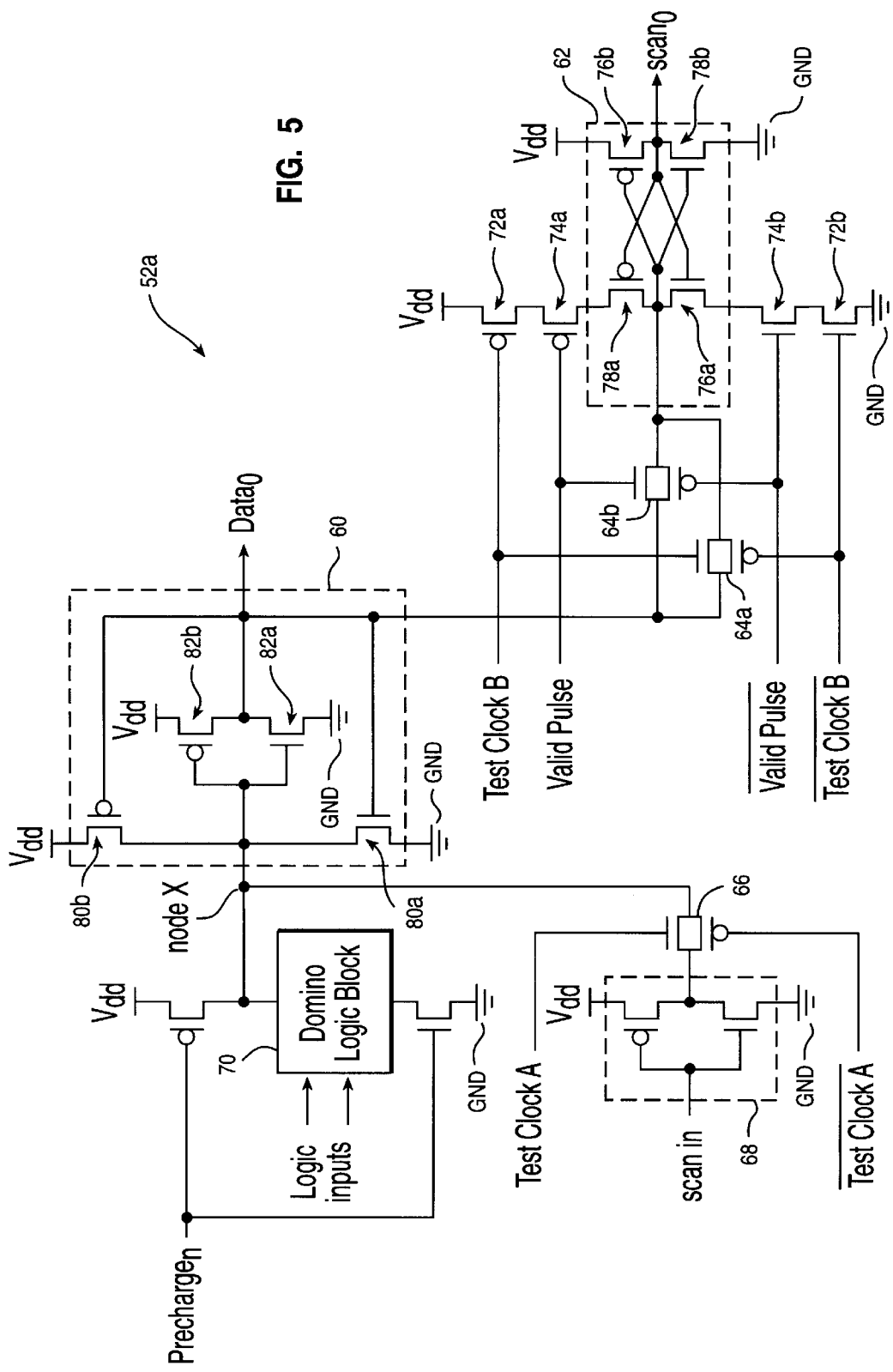
FIG. 5 is a schematic electrical circuit diagram of a domino logic circuit of the self-resetting logic row of FIG. 4.

FIG. 5 is a schematic electrical circuit diagram of domino logic circuit 52a. Domino logic circuit 52a is a representative one of domino logic circuits 52a–c, which are substantially identical to one another. In FIG. 5, a voltage supply node Vdd has a voltage=approximately 2.5 volts relative to a voltage reference node GND.

Domino logic circuit 52a includes (1) a latch formed by back-to-back complementary metal oxide semiconductor ("CMOS") inverters, indicated by dashed enclosure 60, (2) a clocked feedback circuit, indicated by dashed enclosure 62, (3) transfer gates 64a–b and 66, (4) a CMOS inverter 68, and (5) a domino logic block 70. In an alternative embodiment, latch 60 is replaced by a clocked feedback circuit similar to circuit 62.

Inverter 68 has (1) an input connected to the Scan In line and (2) an output connected to transfer gate 66. Accordingly, a Scan In node of circuit "a" is formed by the input of inverter 68 of domino logic circuit 52a of logic row 42d. As shown in FIG. 5, (1) back-to-back CMOS inverters 60 include transistors 80a–b and 82a–b, and (2) clocked feedback circuit 62 includes transistors 76a–b and 78a–b.

Domino logic block 70 receives data signals through Logic Inputs from Row$_{n-1}$ Output lines. In a significant aspect of the illustrative embodiment, Data$_0$ does not pass through the scannable latch portion (including circuit 62, transfer gates 64a–b and 66, and inverter 68) of domino logic circuit 52a, thereby substantially preserving the speed of Data$_0$ transitioning in response to signals at Logic Inputs. However, a slight speed penalty is incurred due to slight additional loading from the stainable latch portion.

The functional mode occurs in response to the Test Enable line (FIG. 4) having a logic 0 state. In the functional mode, domino logic circuit 52a operates as both (1) a domino circuit and (2) a capture latch. During operation of logic row 42d in the functional mode, a boundary between adjacent cycles occurs when control circuit 44 (FIG. 4) outputs a logic 0 state (i.e. a voltage=approximately 0 volts) on the Precharge$_n$ line. While domino logic circuit 52a operates in the functional mode, control circuit 44 outputs (1) a logic 0 state on the Test Clock A line and a logic 1 state (i.e. a voltage=approximately 2.5 volts) on its associated $\overline{\text{Test Clock A}}$ line, and (2) a logic 0 state on the Test Clock B line and a logic 1 state on its associated $\overline{\text{Test Clock B}}$ line.

While control circuit 44 outputs a logic 0 state on the Precharge$_n$ line, control circuit 44 also outputs a logic 0 state on the Valid Pulse line and a logic 1 state on its associated $\overline{\text{Valid Pulse}}$ line. Accordingly, in response to control circuit 44 outputting a logic 0 state on the Precharge$_n$ line, (1) a node X is precharged to a logic 1 state, (2) each of transfer gates 64a–b is substantially turned off, (3) each of transistors 72a–b and 74a–b is substantially turned on, and (4) an existing logic state of Scan$_0$ is latched by clocked feedback circuit 62. For example, if the existing logic state of Scan$_0$ is a logic 1 state, then each of transistors 76a–b is substantially turned on while each of transistors 78a–b is substantially turned off, such that transistors 72b, 74b and 76a–b latch the logic 1 state at Scan$_0$. By comparison, if the existing logic state of Scan0 is a logic 0 state, then each of transistors 78a–b is substantially turned on while each of transistors 76a–b is substantially turned off, such that transistors 72a, 74a and 78a–b latch the logic 0 state at Scan$_0$.

After a sufficient amount of time elapses to ensure that node X is precharged to a logic 1 state and that an existing logic state of Scan$_0$ is latched by clocked feedback circuit 62, control circuit 44 outputs (1) a logic 1 state on the Precharge$_n$ line and (2) a logic 1 state on the Valid Pulse line and a logic 0 state on its associated $\overline{\text{Valid Pulse}}$ line. Accordingly, in response to control circuit 44 outputting a logic 1 state on the Precharge$_n$ line during the functional mode, (1) circuit 52a selectively discharges node X to a logic 0 state in response to signals at Logic Inputs (i.e. node X may or may not be discharged, depending upon logic states of Logic Inputs), (2) each of transistors 74a–b is substantially turned off, and (3) transfer gate 64b is substantially turned on, so that $Scan_0$ has a logic state equal to that of node X.

In the illustrative embodiment, control circuit 44 ensures the Valid Pulse line has a logic 1 state (and its associated $\overline{\text{Valid Pulse}}$ line has a logic 0 state) (1) for a sufficiently long duration to ensure that $Scan_0$ has a logic state inverted from that of $Data_0$ after $Precharge_n$ transitions to a logic 1 state and (2) for a sufficiently short duration to ensure that the Valid Pulse line has a logic 0 state (and its associated $\overline{\text{Valid Pulse}}$ line has a logic 1 state) before the $Precharge_n$ line transitions back to a logic 0 state. It becomes more difficult for control circuit 44 to concurrently achieve both of these durational goals if the duration of the $Precharge_n$ line in the logic 1 state is shortened to achieve faster cycle times. During the functional mode, since each of the Test Clock A and Test Clock B lines has a logic 0 state (and each of their associated $\overline{\text{Test Clock A}}$ and $\overline{\text{Test Clock B}}$ lines has a logic 1 state), the Scan In line is electrically isolated from affecting the logic states of $Data_0$ and $Scan_0$.

The test mode occurs in response to the Test Enable line (FIG. 4) having a logic 1 state. In the test mode, circuit 52a operates as a shift-register-latch. During operation of logic row 42d in the test mode, a boundary between adjacent cycles occurs when control circuit 44 outputs a logic 1 state on the Test Clock A line. In response to the Test Enable line (FIG. 4) having a logic 1 state, control circuit 44 operates in the test mode and outputs (1) a logic 1 state on the $Precharge_n$ line, and (2) a logic 0 state on the Valid Pulse line and a logic 1 state on its associated $\overline{\text{Valid Pulse}}$ line.

While control circuit 44 outputs a logic 1 state on the Test Clock A line, control circuit 44 also outputs (1) a logic 0 state on the $\overline{\text{Test Clock A}}$ line, (2) a logic 0 state on the Test Clock B line, and (3) a logic 1 state on the $\overline{\text{Test Clock B}}$ line. Accordingly, in response to control circuit 44 outputting a logic 1 state on the Test Clock A line, (1) transfer gate 66 is substantially turned on, so that node X has a logic state inverted from that of Scan In, (2) transfer gates 64a-b are substantially turned off, (3) transistors 72a–b and 74a–b are substantially turned on, and (4) an existing logic state of $Scan_0$ is latched by clocked feedback circuit 62.

After a sufficient amount of time elapses to ensure that node X has a logic state inverted from that of Scan In and that an existing logic state of $Scan_0$ is latched by clocked feedback circuit 62, control circuit 44 outputs (1) a logic 0 state on the Test Clock A line and a logic 1 state on its associated $\overline{\text{Test Clock A}}$ line and (2) a logic 1 state on the Test Clock B line and a logic 0 state on its associated $\overline{\text{Test Clock B}}$ line. Accordingly, in response to control circuit 44 outputting a logic 0 state on the Test Clock A line during the test mode, (1) each of transistors 72a–b is substantially turned off, and (3) transfer gate 64a is substantially turned on, so that $Scan_0$ has a logic state equal to that of node X.

Although $Precharge_n$ has a logic 1 state during the test mode, the Logic Inputs to domino logic block 70 do not affect the logic state of node X during the test mode. This is because control circuit 44 operates to ensure that each of $Strobe_0$ through $Precharge_{n-1}$ has a logic 0 state during the test mode (i.e. while the Test Enable line has a logic 1 state). Consequently, during the test mode, the logic state of node X is responsive to the logic state of Scan In, but is not responsive to the logic states of the Logic Inputs to domino logic block 70 (even if such logic states of the Logic Inputs are changing).

Accordingly, during operation of logic row 42d in the test mode, at a cycle's end, (1) circuit 52a operates so that $Scan_0$ has a logic state inverted from the logic state that Scan In had at the cycle's beginning, (2) circuit 52b operates so that $Scan_1$ has a logic state inverted from the logic state that $Scan_0$ had at the cycle's beginning, and (3) circuit 52c operates so that Scan Out has a logic state inverted from the logic state that $Scan_1$ had at the cycle's beginning. In that manner, during the test mode, domino logic circuits 52a–c together form a serial data path within logic row 42d of self-timed logic circuit "a". through which test information (e.g. test data) is serially scanned (i.e. received) into logic circuits 52a–c.

FIG. 6 is a schematic electrical circuit diagram of valid logic circuit 50 of logic row 42d (FIG. 4). Notably, circuit 50 is identical to circuit 52a (FIG. 5), except that (1) circuit 50 does not include clocked feedback circuit 62, transfer gates 64a–b and 66, inverter 68, and transistors 72a–b and 74a–b and (2) the gate of transistor 80a is connected to a Set Valid Pulse line (of the Valid Pulses lines of FIG. 4) instead of the $Valid_{out}$ line (such that transistors 80a–b and 82a–b no longer form back-to-back CMOS inverters).

The test mode occurs in response to the Test Enable line (FIG. 4) having a logic 1 state. In response to the Test Enable line (FIG. 4) transitioning from a logic 1 state to a logic 0 state, (1) control circuit 44 stops operating in the test mode, (2) control circuit 44 continues outputting a logic 1 state on the $Precharge_n$ line, (3) a decoder selectively outputs a logic 1 state on the Set Valid line to control circuit 44 as discussed further hereinbelow in connection with FIG. 11, (4) in response to the logic 1 state on the Set Valid line, control circuit 44 outputs a rising edge pulse signal on the Set Valid Pulse line to the gate of transistor 80a of valid logic circuit 50 of logic row 42d as discussed further hereinbelow in connection with FIG. 8, (5) in response to the rising edge pulse signal on the Set Valid Pulse line, circuit 50 charges the $Valid_{out}$ line to a logic 1 state, (6) in response to the logic 1 state on the $Valid_{out}$ line, control circuit 44 outputs a logic 1 state on the Valid Pulse line and a logic 0 state on its associated $\overline{\text{Valid Pulse}}$ line, as discussed further hereinbelow in connection with FIG. 8, and (7) control circuit 44 ensures the Valid Pulse line has a logic 1 state (and its associated $\overline{\text{Valid Pulse}}$ line has a logic 0 state) for a sufficiently long duration to ensure that $Scan_0$ has a logic state inverted from that of $Data_0$.

FIGS. 7a–c are schematic electrical circuit diagrams of example domino logic blocks of the circuits of FIGS. 5 and 6. FIG. 7a shows a 2-input AND gate. FIG. 7b shows a 2-input OR gate. FIG. 7c shows a 2-input multiplexer.

Figure 8:
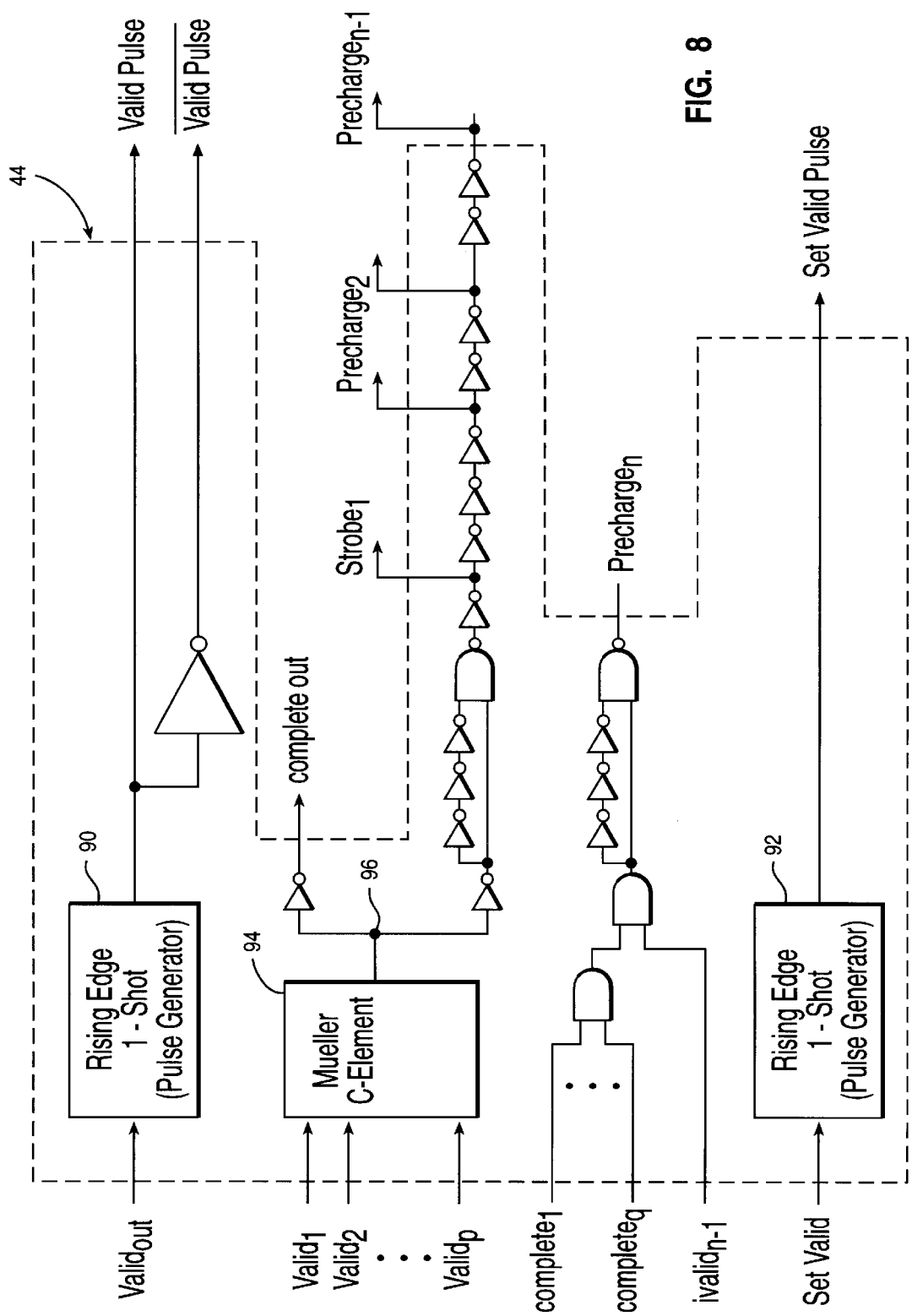
FIG. 8 is a schematic electrical circuit diagram of a control circuit of the self-resetting logic row of FIG. 4.
Figure 9:
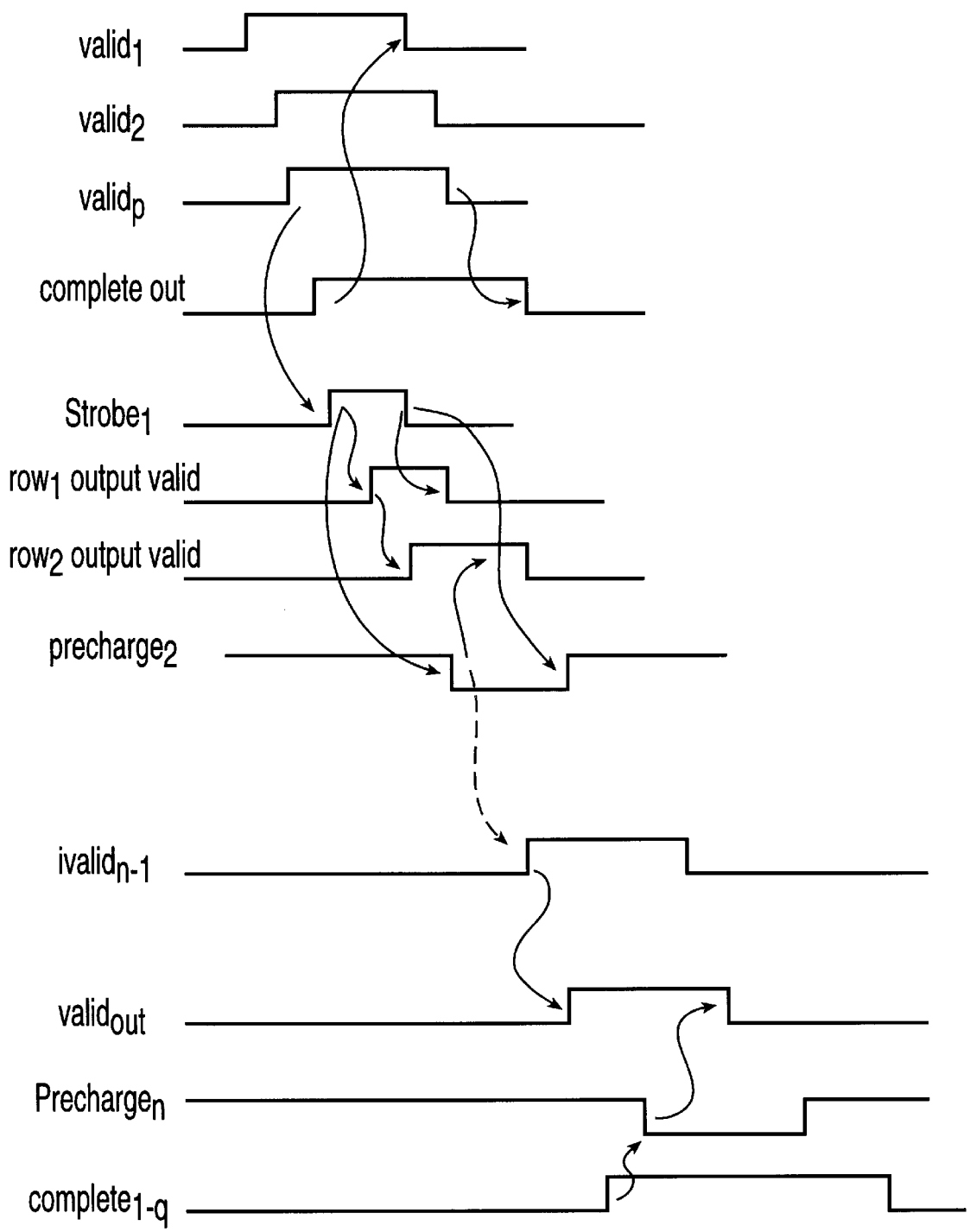
FIG. 9 is a timing diagram of the operation of the control circuit of FIG. 8.

FIG. 8 is a schematic electrical circuit diagram of control circuit 44. FIG. 9 is a timing diagram of the operation of control circuit 44 of FIG. 8. In the functional mode, control circuit 44 generally operates as a self-timed system. For clarity, various connections and signals of control circuit 44 are not shown in FIG. 8 but are discussed further hereinabove in connection with FIGS. 2–6. Control circuit 44 is an improved version of the control circuit discussed in U.S. Pat. No. 5,565,798, which is hereby fully incorporated by reference herein.

Significantly, control circuit 44 includes Rising Edge 1-Shot pulse generators 90 and 92. In response to the $Valid_{out}$ line transitioning from a logic 0 state to a logic 1 state, pulse generator 90 outputs (1) a rising edge pulse (i.e. a pulse having a logic 1 state) on the Valid Pulse line and (2) a falling edge pulse (i.e. a pulse having a logic 0 state) on the $\overline{\text{Valid Pulse}}$ line. Similarly, in response to the Set Valid line transitioning from a logic 0 state to a logic 1 state, pulse generator 92 outputs a rising edge pulse on the Set Valid Pulse line. The $Valid_{out}$, Valid Pulse, $\overline{\text{Valid Pulse}}$, Set Valid and Set Valid Pulse lines are discussed further hereinabove in connection with FIGS. 2–6.

Control circuit 44 receives valid signals through Valid Inputs lines from the "Valid Signals from Sources" node of circuit "a", As shown in FIG. 8, the Valid Inputs lines include (1) the $ivalid_{n-1}$ line and (2) $valid_1$ through $valid_p$ lines (where p is an integer number). A Mueller C-element 94 receives valid signals from the $valid_1$ through $valid_p$ lines.

As shown in FIG. 9, in response to all the data signals of $Input_1$ through $Input_p$ concurrently being valid, all $valid_1$ through $valid_p$ lines concurrently have a logic 1 state. In response to all $valid_1$ through $valid_p$ lines concurrently having a logic 1 state, (1) Mueller C-element 94 outputs a logic 0 state at a node 96, and (2) control circuit 44 outputs a logic 1 state on the Complete Out line. In response to the logic 1 state on the Complete Out line, a source device performs a precharge operation within the source device and therefore clears one or more of the $valid_1$ through $valid_p$ lines to a logic 0 state, as shown in FIG. 9. In response to one or more of the $valid_1$ through $valid_p$ lines having a logic 0 state, (1) Mueller C-element 94 outputs a logic 1 state at node 96, and (2) control circuit 44 outputs a logic 0 state on the Complete Out line.

Shortly after control circuit 44 outputs a logic 1 state on the Complete Out line, control circuit 44 outputs a rising edge pulse on the $Strobe_1$ line. In response to the rising edge pulse on the $Strobe_1$ line, logic row 42a performs operations and outputs data signals and one or more valid signals to logic row 42b through $Row_1$ Output lines. Before receiving the rising edge pulse on the $Strobe_1$ line, logic row 42a continuously performs a precharge operation within logic row 42a (similar to the precharge operation discussed hereinabove in connection with FIGS. 5 and 6 when $Precharge_n$ has a logic 0 state) in response to control circuit 44 outputting a logic 0 state on the $Strobe_1$ line.

Advantageously, while logic 42a performs the precharge operation, the logic states of $Input_1$ through $Input_p$ are able to change without negatively affecting the proper operation of circuit "a". Moreover, this permits logical inversions. However, a small speed cost results from such an implementation.

In response to the data signals and valid signals from $Row_1$ Output lines, logic row 42b performs operations and outputs data signals and one or more valid signals to logic row 42c through $Row_2$ Output lines. Shortly after logic row 42b outputs data signals and one or more valid signals to logic row 42c through $Row_2$ Output lines, control circuit 44 outputs a falling edge pulse on the $Precharge_2$ line. In response to the falling edge pulse on the $Precharge_2$ line, logic row 42b performs a precharge operation within logic row 42b and therefore clears at least one valid signal through $Row_2$ Output lines, thereby indicating that at least one data signal through $Row_2$ Output lines is invalid.

In response to the data signals and valid signals from $Row_2$ Output lines (received by logic row 42c before logic row 42b clears at least one valid signal through $Row_2$ Output lines), logic row 42c performs operations and outputs data signals and valid signals (including a logic 1 state on the $ivalid_{n-1}$ line) to logic row 42d through $Row_{n-1}$ Output lines. Shortly after logic row 42c outputs data signals and one or more valid signals to logic row 42d through $Row_{n-1}$ Output lines, control circuit 44 outputs a falling edge pulse on the $Prechargen_{n-1}$ line. In response to the falling edge pulse on the $Prechargen_{n-1}$ line, logic row 42c performs a precharge operation within logic row 42c and therefore clears at least one valid signal (e.g. clears the $ivalid_{n-1}$ line to a logic 0 state) through $Row_{n-1}$ Output lines, thereby indicating that at least one data signal through $Row_{n-1}$ Output lines is invalid.

In response to the data signals and valid signals from $Row_{n-1}$ Output lines (received by logic row 42d before logic row 42c clears at least one valid signal through $Row_{n-1}$ Output lines), logic row 42d performs operations and outputs (1) valid data signals through the $Data_0$, $Data_1$ and $Data_{n-1}$ ("Data Output") lines to the "Data Output Signals" node of circuit "a" and (2) a logic 1 state on the $Valid_{out}$ line to the "Valid Output Signal" node of circuit "a".

Also, control circuit 44 receives acknowledgement signals through Complete Inputs lines from the "Completion Signals from Sinks" node of circuit "a". As shown in FIG. 8, the Complete Inputs lines include $complete_1$ through $complete_q$ lines (where q is an integer number). As shown in FIG. 9, in response to all $complete_1$ through $complete_q$ lines concurrently having a logic 1 state while the $ivalid_{n-1}$ line has a logic 1 state, control circuit 44 outputs a falling edge pulse on the $Precharge_n$ line.

In response to the falling edge pulse on the $Precharge_n$ line, logic row 42d performs a precharge operation within logic row 42d (as discussed further hereinabove in connection with FIGS. 5 and 6) and therefore clears the $Valid_{out}$ line to a logic 0 state, thereby indicating that at least one data signal through the Data Output lines (i.e. $Data_0$, $Data_1$ and $Data_{n-1}$) is invalid.

In a significant aspect of the illustrative embodiment, circuit "a" implements the Scan In, Scan Out, Test Enable, and Test Clocks lines, and circuitry associated with such lines. Nevertheless, it is not necessary that all of circuits "a", "b", "c" and "d" implement such lines and circuitry. Instead, less than all of circuits "a", "b", "c" and "d" implement such lines and circuitry, in order to reduce the total amount of additional circuitry, so long as sufficient test coverage is still achieved. If less than all of circuits "a", "b", "c" and "d" implement such lines and circuitry, then care is taken to properly account for the following: in response to a complete self-timed system being released to perform an operation, the results of the system's operation are responsive to information (e.g. data signals) from the top-most active logic row within the self-timed system.

Figure 10:
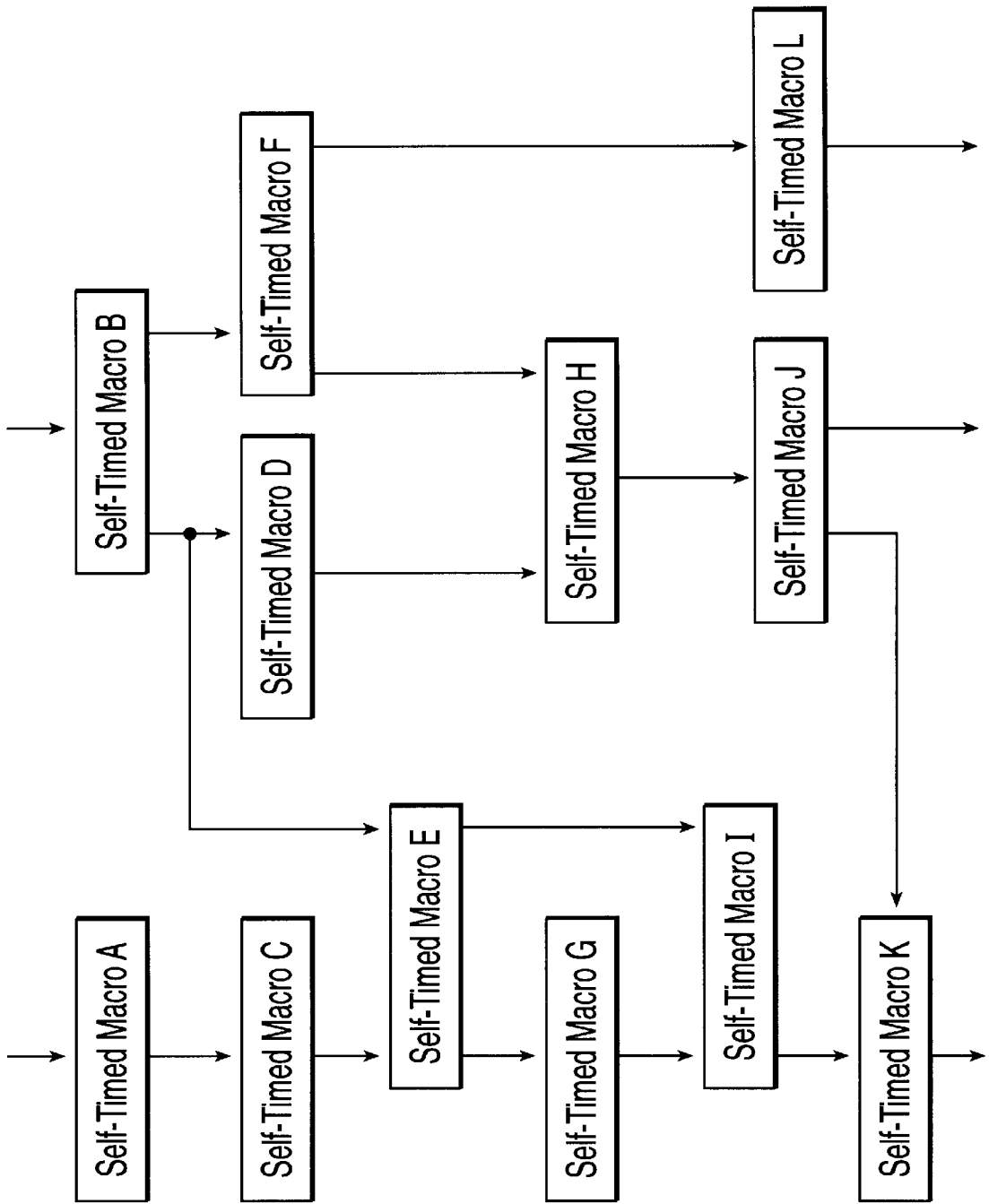
FIG. 10 is an example dataflow diagram of information transfer between self-timed macros.

FIG. 10 is an example dataflow diagram of information transfer between self-timed macros. Each single macro is either (1) a single self-timed logic circuit such as circuit "a" of FIG. 2 or (2) a combination of multiple self-timed logic circuits such as the combination of circuits "a", "b", "c" and "d" of FIG. 2. For clarity, various connections and signals between macros are not shown in FIG. 10 but are discussed further hereinabove in connection with FIGS. 2–9. As shown in FIG. 10, a self-timed system of the illustrative embodiment includes macros A, B, C, D, E, F, G, H, I, J, K and L. Together, macros A, B, C, D, E, F, G, H, I, J, K and L form a hierarchical chain of macros within the self-timed system.

In FIG. 10, macros A and B receive information (e.g. data signals and/or information from a bus) from a source device (not shown in FIG. 10 for clarity). Macros J, K, and L output information to a source device. Accordingly, operation of the hierarchical chain of self-timed macros in FIG. 10 begins with the activation of macros A and B and finishes after macros J, K, and L output valid information.

In the example of FIG. 10, one or more of macros A, B, C, D, E, F, G, H, I, J, K and L include(s) the Scan In, Scan Out, Test Enable, and Test Clocks lines, together with circuitry (discussed further hereinabove in connection with FIGS. 4–9) associated with such lines, according to which of the macros A, B, C, D, E, F, G, H, I, J, K and L is to be tested. For example, in order to minimize the total amount of such lines and circuitry while ensuring sufficient test coverage in the illustrative embodiment, such lines and circuitry are included only within (1) a particular "destination" macro which is to be tested and (2) an associated selected set of one or more "source" macros as shown below in Table 1, according to the particular "destination" macro.

TABLE 1

Combination of Macros for Test in FIG. 10

| Tested Macro | Source Macros | Comments |
|---|---|---|
| A | (none) | Results from this macro are tested in response to information from a source device |
| B | (none) | Results from this macro are tested in response to information from a source device |
| C | A | A sets up all inputs for C |
| D | B | B sets up all inputs for D |
| E | B/C | A is an alternative to C |
| F | B | B sets up all inputs for F |
| G | E | B/C is an alternative to E, and so is A/B |
| H | D/F | B is an alternative to D/F |
| I | G/E | B/C is an alternative to G/E, and so is A/B |
| J | H | D/F is an alternative to H, and so is B |
| K | I/J | G/E is an alternative to I, so is B/C, and so is A/B; H is an alternative to J, so is D/F, and so is B |
| L | F | B is an alternative to F |

For example, if only macro F is being tested, then only macros B and F would include such lines and circuitry. Table 1 clearly shows that, for the particular "destination" macro to be tested, such lines and circuitry would be included within (1) the particular "destination" macro and (2) the selected set of "source" macro(s) at a higher level relative to the "destination" macro within the hierarchical chain of self-timed macros. A "source" macro is any macro from which the particular "destination" macro receives (directly or indirectly) data signals and/or valid signals. Thus, the particular "destination" macro is at a lower level relative to its "source" macro(s) within the hierarchical chain of self-timed macros.

For the particular "destination" macro to be tested, the selected set of "source" macro(s) is that which controls all data signals and valid signals received by the particular "destination" macro. For example, if the particular "destination" macro is H: (1) the selected set has "source" macros D and F, because macros D and F together control all data signals and valid signals received by macro H; and (2) alternatively, the selected set has only "source" macro B, because macro B controls all data signals and valid signals received by macros D and F, and in that manner, macro B likewise controls all data signals and valid signals received by macro H. Thus, it is possible for less than all of macros A, B, C, D, E, F, G, H, I, J, K and L to include such lines and circuitry, according to which particular "destination" macro is to be tested.

Accordingly, macro B is coupled through macros D and F to macro H. Macro B outputs first information in response to first acknowledgement signals. Macros D and F output second information and the first acknowledgement signals in response to macros D and F receiving portions of the first information from macro B. Such portions and the first acknowledgement signals are output asynchronously with respect to one another. Macros D and F output the second information in response to second acknowledgement signals. During the functional mode of operation, macros D and F output the second information always in response to the first information from macro B. Macro H outputs third information and the second acknowledgement signals in response to macro H receiving portions of the second information from macros D and F. Such portions and the second acknowledgement signals are output asynchronously with respect to one another.

A test circuit (e.g. decoder 90 of FIG. 11) is coupled to macros D, F and H. The test circuit specifies the second information output from macros D and F, so that macro H outputs the third information in response to the specified second information independent of the first information output from macro B during the test mode of operation. In an alternative embodiment, the test circuit is further coupled to macro B, and the test circuit specifies the first information output from macro B, so that macros D and F output the second information in response to the specified first information.

Figure 11:
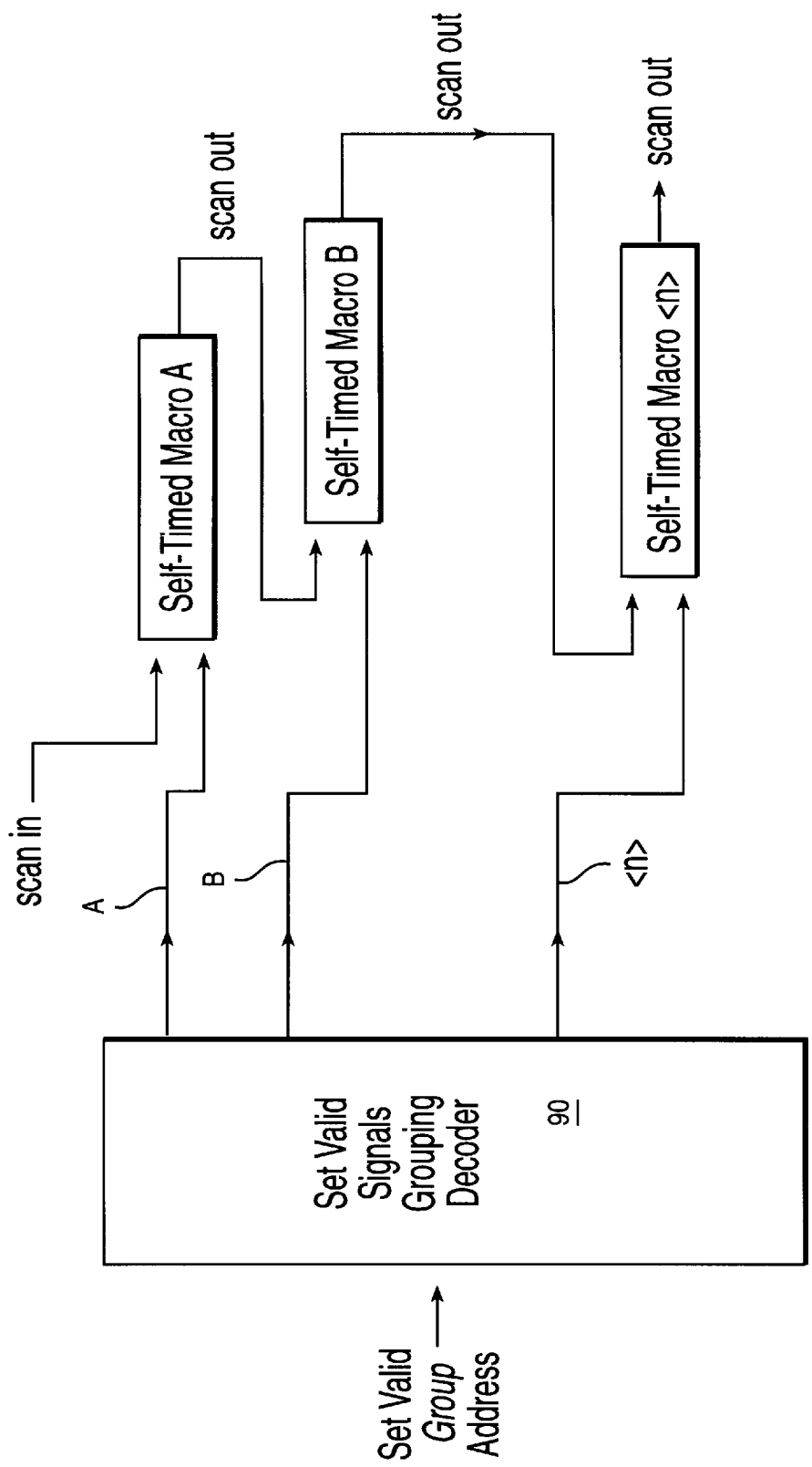
FIG. 11 is a block diagram of a testable self-timed system including a set valid signals grouping decoder of the illustrative embodiment.

FIG. 11 is a block diagram of a testable self-timed system including a Set Valid signals grouping decoder 90 of the illustrative embodiment. For clarity, various connections and signals between macros are not shown in FIG. 11 but are discussed further hereinabove in connection with FIGS. 2–10. FIG. 11 shows decoder 90 having (1) a first Set Valid line A connected to self-timed macro A, (2) a second Set Valid line B connected to self-timed macro B, and (3) a third Set Valid line <n> connected to self-timed macro <n>. Macro <n> can be any of macros C, D, E, F, G, H, I, J, K or L of FIG. 10.

In response to a set valid group address, decoder 90 selectively outputs a logic 1 state on one or more of lines A, B, and <n>. Moreover, FIG. 11 shows a Scan In line connected to macro A. The Scan Out line of macro A is connected to the Scan In node of macro B. The Scan Out line of macro B is connected to the Scan In node of macro <n>. Macro <n> has a Scan Out line from which information (resulting from operation of the self-timed system in the functional mode) is serially scanned for analysis to determine whether the self-timed system operated properly.

For testing the particular "destination" macro, test information is serially scanned (as discussed hereinabove in connection with FIG. 4) into all "source" macro(s) belonging to the selected set. This serial scanning occurs while at least the "source" macro(s) (belonging to the selected set) are in the test mode. After serially scanning test information into all "source" macros belonging to the selected set, the Test Enable line is cleared to a logic 0 state. Accordingly, in that event, (1) decoder 90 outputs logic 1 states on all Set Valid lines connected to all "source" macro(s) (belonging to the selected set) and to the particular "destination" macro and (2) in response to such logic 1 states on the Set Valid lines, such macros operate as discussed further hereinabove in connection with FIG. 6. Subsequently, (1) at least the "destination" macro is placed in the test mode, and (2) information is serially scanned out of the "destination" macro through the "destination" macro's Scan Out line for analysis to determine whether the self-timed system operated properly.

It is possible (although not required) for all "source" macro(s) (belonging to the selected set) and the particular "destination" macro to be connected to a single Set Valid line. In that situation, after serially scanning test information into all "source" macros belonging to the selected set, (1) the Test Enable line is cleared to a logic 0 state, (2) a decoder (such as decoder 90) outputs a logic 1 state on the single Set Valid line connected to all "source" macro(s) (belonging to the selected set) and to the particular "destination" macro, and (3) in response to the logic 1 state on the single Set Valid line, such macros operate as discussed farther hereinabove in connection with FIG. 6.

For example, with reference to FIG. 10 and Table 1, if macro I is the "destination" macro being tested, then the selected set of "source" macros includes only macros E and G. Accordingly, in one embodiment, macros E, G and I are connected to a single Set Valid line. After serially scanning test information into macros E and G, (1) the Test Enable line is cleared to a logic 0 state, (2) a decoder (such as decoder 90) outputs a logic 1 state on the single Set Valid line connected to macros E, G and I, and (3) in response to the logic 1 state on the single Set Valid line, such macros operate as discussed further hereinabove in connection with FIG. 6. Subsequently, (1) at least the macro I is placed in the test mode, and (2) information is serially scanned out of macro I through macro I's Scan Out line for analysis to determine whether the self-timed system operated properly.

Advantageously, it is not necessary to serially scan test information into "source" macros other than the selected set of "source" macros. Thus, in the example of the immediately preceding paragraph, macro I is testable irrespective of whether test information is serially scanned into macros A, B and C. This is true, even though macros A, B and C (in addition to macros E and G) are "source" macros for macro I.

It is not necessary to serially scan test information into "source" macros other than the selected set of "source" macros, because (1) the single Set Valid line is not connected to "source" macros other than the selected set of "source" macros and/or (2) the decoder outputs a logic 1 state only to Set Valid line(s) connected to the particular "destination" macro (to be tested) and its associated selected set of "source" macros. Thus, in the example of the immediately preceding paragraph, the single Set Valid line is disconnected from macros A, B and C. Consequently, in response to the decoder outputting a logic 1 state on the single Set Valid line, macro I operates irrespective of information in macros A, B and C.

This technique is applicable to any "destination" macro if (1) it includes the Scan In, Scan Out, Test Enable, and Test Clocks lines, together with circuitry (discussed further hereinabove in connection with FIGS. 4–9) associated with such lines and (2) all "source" macros (belonging to the "destination" macro's associated selected set) likewise include such lines and circuitry. In that manner, separate "destination" macros can be tested within the self-timed system, rather than testing the entire system. As indicated in the example of the immediately preceding paragraph, it is possible for less than all macros (within the self-timed system) to implement such lines and circuitry, in order to reduce the total amount of additional circuitry, while still achieving sufficient test coverage.

This is a significant aspect of the testable self-timed system of the illustrative embodiment. Moreover, with this technique of the illustrative embodiment, test information is more readily provided to "source" macros, the time for testing is reduced, and defects are more precisely identified. The decoder selectively outputs logic 1 states on various Set Valid lines connected to the macros, in accordance with the technique of FIGS. 10 and 11, as discussed further hereinabove.

For each control line, Table 2 indicates whether such control line is active during the functional mode, test mode, or both.

TABLE 2

Activation of Control Lines

| Signal | Mode |
| --- | --- |
| Data Inputs | Functional |
| Valid Inputs | Functional |
| Complete Out | Functional |
| Complete | Functional |
| Precharge | Functional |
| Strobe | Functional |
| Ivalid$_{n-1}$ | Functional |
| Data Outputs | Functional & Test |
| Valid Output | Functional & Test |
| Valid Pulse | Functional |
| Test Enable | Test |
| Test Clock A | Test |
| Test Clock B | Test |
| Scan In | Test |
| Scan Out | Test |
| Set Valid | Test |
| Set Valid Pulse | Test |

For each test line, Table 3 indicates whether each macro (to be tested) is connected to a respective one of such test lines (i.e. (1) whether the number of such test lines equals the number of macros to be tested, or instead (2) whether a single one of such test lines is connected to all macros to be tested).

TABLE 3

Number of Test Lines

| Signal | Equals # of macros |
| --- | --- |
| Test Enable | No |
| Test Clock A | No |
| Test Clock B | No |
| Scan In | See example of FIG. 11 |
| Scan Out | See example of FIG. 11 |
| Set Valid | See discussion herein above in connection with FIG. 10 and 11 |

Although an illustrative embodiment and its advantages have been described in detail hereinabove, they have been described as example and not as limitation. Various changes, substitutions and alterations can be made in the illustrative embodiment without departing from its breadth, scope and spirit.

What is claimed is:

1. Multiple stage self-timed circuitry system with scan resources, comprising:

a first asynchronous logic circuit for outputting first information in response to a receipt of first completion signals;

a second asynchronous logic circuit coupled to said first asynchronous logic circuit for outputting second information and one of said first completion signals, said second information being derived from said first information received from said first asynchronous logic circuit during a functional mode of operation, and said one of said first completion signals being output asynchronously with respect to information received from said first asynchronous logic circuit;

a third asynchronous logic circuit operable to output third information in response to an input of selected information; and a synchronously operable test circuit coupled between said second and third asynchronous logic circuits for selectively inputting into said third asynchronous logic circuit either second information during a functional mode of operation, or scan information during a test mode of operation.

2. The system of claim 1 wherein said second asynchronous logic circuit outputs said second information in response to the content of said first information during said functional mode of operation.

3. The system of claim 1 wherein said synchronously operable test circuit is coupled to said first asynchronous logic circuit to enable an output of said first information from said first asynchronous logic circuit and said second asynchronous logic circuit outputs of said second information in response to said first information.

4. A method of testing multiple stage self-timed circuitry, comprising the steps of:

outputting from a first asynchronous logic circuit first information in response to a receipt of first completion signals;

outputting from a second asynchronous logic circuit coupled to said first asynchronous logic circuit second information and one of said first completion signals, said second information being derived from said first information received from said first asynchronous logic circuit during a functional mode of operation, and said one of said first completion signals being output asynchronously with respect to information received from said first asynchronous logic circuit;

outputting from a third asynchronous logic circuit third information in response to on input of selected information; and selectively inputting into said third asynchronous logic circuit, from a synchronously operable test circuit coupled between said second and third asynchronous logic circuits, either second information during a functional mode of operation, or scan information during a test mode of operation.

5. The method of claim 4 wherein said step of outputting said second information from said second asynchronous logic circuit comprises outputting said second information in response to the content of said first information during said functional mode of operation.

6. The method of claim 4 comprising the further step of:

enabling by said synchronously operable test circuit the output of said first information from said first asynchronous logic circuit and said second information from said second asynchronous logic circuit in response to said first information.

* * * * *